US012775866B2

(12) United States Patent
Singh et al.

(10) Patent No.: US 12,775,866 B2
(45) **Date of Patent: *Oct. 27, 2026**

(54) DISTRIBUTED RADIO FREQUENCY SUPERCONDUCTING QUANTUM INTERFERENCE DEVICES FOR QUBIT STATE DETECTION USING A SUPERCONDUCTING CONTROL WIRE

(71) Applicant: Dell Products L.P., Round Rock, TX (US)

(72) Inventors: Tejinder Singh, Manotick (CA); Navjot Kaur Khaira, Manotick (CA)

(73) Assignee: Dell Products L.P., Round Rock, TX (US)

( * ) Notice: Subject to any disclaimer, the term of this patent is extended or adjusted under 35 U.S.C. 154(b) by 82 days.

This patent is subject to a terminal disclaimer.

(21) Appl. No.: 18/919,218

(22) Filed: Oct. 17, 2024

(65) Prior Publication Data

US 2026/0111780 A1 Apr. 23, 2026

(51) Int. Cl.
*G06N 10/40* (2022.01)
*H03K 3/38* (2006.01)

(52) U.S. Cl.
CPC ............... *G06N 10/40* (2022.01); *H03K 3/38* (2013.01)

(58) Field of Classification Search
CPC ................................ G06N 10/40; H03K 3/38
See application file for complete search history.

(56) References Cited

U.S. PATENT DOCUMENTS

| | | | | |
|---|---|---|---|---|
| 6,448,767 | B1 | 9/2002 | Ganther, Jr. | |
| 2018/0026633 | A1 | 1/2018 | Naaman | |
| 2021/0065036 | A1 | 3/2021 | Sank | |
| 2023/0179175 | A1 | 6/2023 | Beck | |
| 2024/0020562 | A1 * | 1/2024 | Miano | G06N 10/40 |
| 2025/0158265 | A1 * | 5/2025 | Strong | H03K 3/38 |

(Continued)

OTHER PUBLICATIONS

B. D. Josephson, "Possible new effects in superconductive tunnelling," Physics letters, vol. 1, No. 7, pp. 251-253, 1962.

(Continued)

*Primary Examiner* — Daniel C Puentes

(74) *Attorney, Agent, or Firm* — Amin, Turocy & Watson, LLP

(57) ABSTRACT

The technology described herein is directed towards real-time monitoring of qubit states in quantum computers using a system based on distributed rf-SQUIDs (radio-frequency superconducting quantum interference devices) and a control line/detection line that carries RF signals from and to a classical computing device. In one implementation, the rf-SQUIDs are distributed at specific distances between superconducting quantum circuit wires, and parallel to the control line/detection wire). The control line facilitates the detection of phase shifts without adding load or noise to the superconducting quantum circuit wires, which enhances the detection of qubit entanglement, decoherence, and/or other qubit state changes. The monitoring and detection system dynamically and precisely monitors qubit state changes and provides real-time feedback to the quantum circuits to adjust the qubit states to maintain the integrity of quantum computations.

20 Claims, 13 Drawing Sheets

(56) References Cited

U.S. PATENT DOCUMENTS

2025/0255196 A1 8/2025 Beck

OTHER PUBLICATIONS

P.W. Anderson and J. M. Rowell, "Probable observation of the Josephson superconducting tunneling effect," Physical Review Letters, vol. 10, No. 6, p. 230-232, 1963.

J. Clarke and A. I. Braginski, "The SQUID Handbook: Fundamentals and Technology of SQUIDs and SQUID Systems, vol. I". New York: Wiley-VCH, 2004. 410 pages.

Singh, et al. "Qubit State Monitoring in Quantum Computers Utilizing Radio Frequency Superconducting Quantum Interference Devices With Classical Computer Readout and Processing" U.S. Appl. No. 18/919,173 filed Oct. 17, 2024, 37 pages.

Notice of Allowance mailed Mar. 10, 2026 for U.S. Appl. No. 18/919,173, 23 pages.

* cited by examiner

DISTRIBUTED RADIO FREQUENCY SUPERCONDUCTING QUANTUM INTERFERENCE DEVICES FOR QUBIT STATE DETECTION USING A SUPERCONDUCTING CONTROL WIRE

RELATED APPLICATION

The subject patent application is related to U.S. patent application Ser. No. 18/919,173, filed Oct. 17, 2024, and entitled "QUBIT STATE MONITORING IN QUANTUM COMPUTERS UTILIZING RADIO FREQUENCY SUPERCONDUCTING QUANTUM INTERFERENCE DEVICES WITH CLASSICAL COMPUTER READOUT AND PROCESSING", the entirety of which patent application is hereby incorporated by reference herein.

BACKGROUND

Quantum computing relies on the accurate manipulation and measurement of qubit states. However, qubit states are highly sensitive to external disturbances and noise, leading to potential errors in quantum computations. Traditional methods of qubit state detection have significant challenges, including with respect to detecting qubit entanglement, decoherence, and/or state changes. Such phenomena involve ultra-small changes that current qubit state detection solutions often fail to detect reliably. Additionally, such existing methods can introduce noise or load that interferes with the accuracy of measurements.

BRIEF DESCRIPTION OF THE DRAWINGS

The technology described herein is illustrated by way of example and not limited to the accompanying figures in which like reference numerals indicate similar elements and in which.

DETAILED DESCRIPTION

Figure 1:
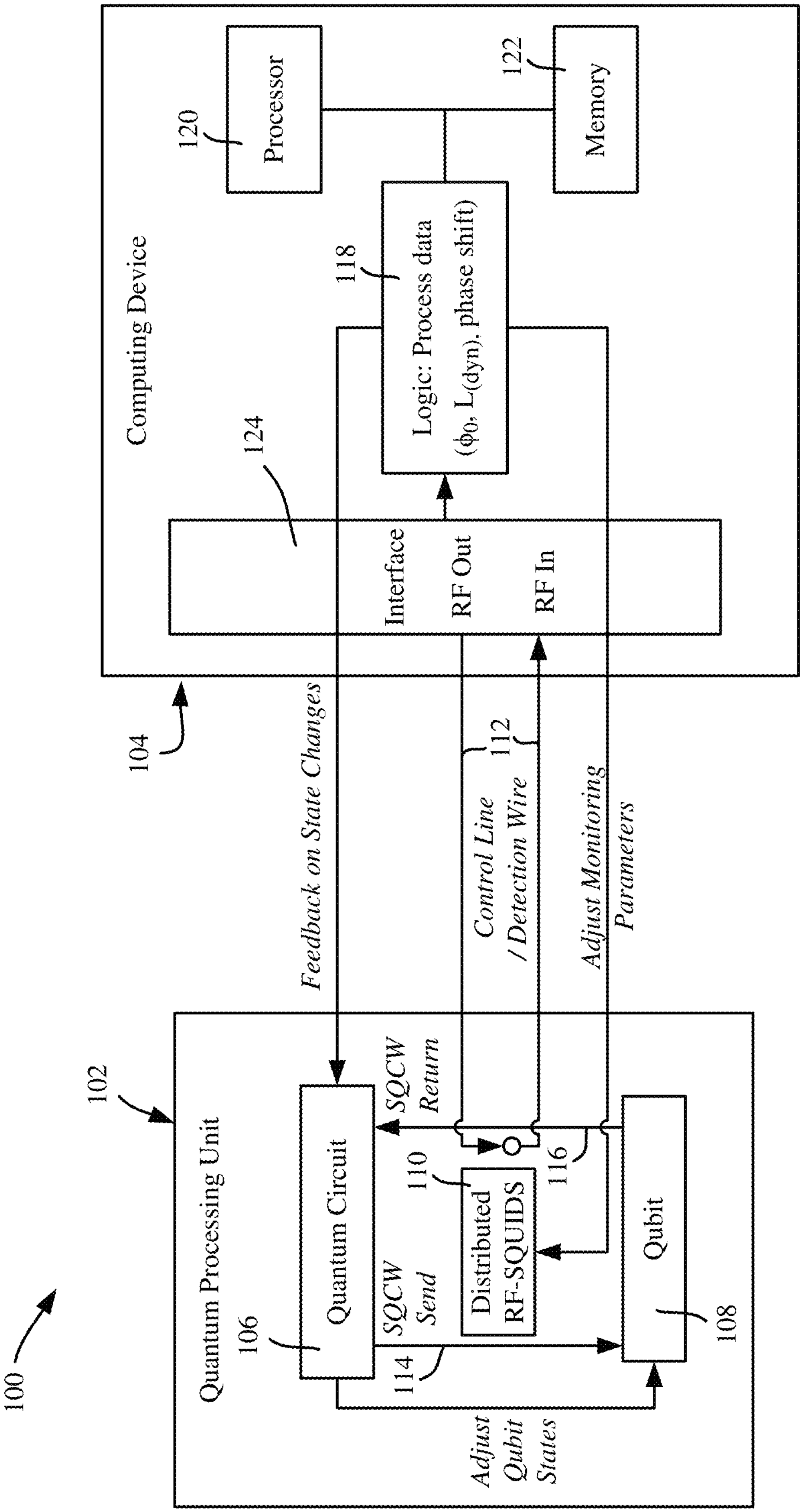
FIG. 1 is a conceptual representation of an example system in which a quantum processing unit device has qubits sensed by radio frequency superconducting quantum interference devices (rf-SQUIDS) coupled via a control line/detection wire to a computing device, in accordance with various example embodiments and implementations of the subject disclosure.

The technology described herein is generally directed towards real-time monitoring of qubit states in quantum computers using distributed rf-SQUIDs (radio-frequency superconducting quantum interference devices). In one implementation, the rf-SQUIDs are distributed at specific distances between superconducting quantum circuit wires (SQCW). An independent control line (which also serves as a detection wire) running a low-power rf signal is positioned between (e.g., parallel to) one of the superconducting quantum circuit wires the SQCW and the group of distributed rf-SQUIDs, which facilitates the detection of phase shifts without adding load or noise to the SQCW. The read-out from these rf-SQUIDs is performed using a computing device such as a classical computer equipped with an accelerator card, enabling precise, real-time monitoring and feedback for improved system stability and fidelity in quantum operations.

The technology described herein thus dynamically and precisely monitors qubit state changes without adding interference, while providing real-time (virtually immediate) feedback to maintain the integrity of quantum computations. Indeed, as will be understood, the use of rf-SQUIDs and the control line/detection wire enhances the detection of qubit entanglement, decoherence, and/or other state changes.

It should be understood that any of the examples and/or descriptions herein are non-limiting. Thus, any of the embodiments, example embodiments, concepts, structures, functionalities or examples described herein are non-limiting, and the technology may be used in various ways that provide benefits and advantages in quantum computing in general.

Reference throughout this specification to "one embodiment," "an embodiment," "one implementation," "an implementation," etc. means that a particular feature, structure, characteristic and/or attribute described in connection with the embodiment/implementation can be included in at least one embodiment/implementation. Thus, the appearances of such a phrase "in one embodiment," "in an implementation," etc. in various places throughout this specification are not necessarily all referring to the same embodiment/implementation. Furthermore, the particular features, structures, characteristics and/or attributes may be combined in any suitable manner in one or more embodiments/implementations. Repetitive description of like elements employed in respective embodiments may be omitted for sake of brevity.

The detailed description is merely illustrative and is not intended to limit embodiments and/or application or uses of embodiments. Furthermore, there is no intention to be bound by any expressed or implied information presented in the preceding sections, or in the Detailed Description section. Further, it is to be understood that the present disclosure will be described in terms of a given illustrative architecture; however, other architectures, structures, materials and process features, and steps can be varied within the scope of the present disclosure.

It also should be noted that terms used herein, such as "optimize," "optimization," "optimal," "optimally" and the like only represent objectives to move towards a more optimal state, rather than necessarily obtaining ideal results. Similarly, "maximize" means moving towards a maximal state (e.g., up to some processing capacity limit), not necessarily achieving such a state, and so on.

It will also be understood that when an element such as a layer, region or substrate is referred to as being "on" or "over" "atop" "above" "beneath" "below" and so forth with respect to another element, it can be directly on the other element or intervening elements can also be present. In contrast, only if and when an element is referred to as being "directly on" or "directly over" another element, are there no intervening element(s) present. Note that orientation is generally relative; e.g., "on" or "over" can be flipped, and if so, can be considered unchanged, even if technically appearing to be under or below/beneath when represented in a flipped orientation. It will also be understood that when an element is referred to as being "connected" or "coupled" to another element, it can be directly connected or coupled to the other element or intervening elements can be present. In contrast, only if and when an element is referred to as being "directly connected" or "directly coupled" to another element, are there no intervening element(s) present.

The following detailed description is merely illustrative and is not intended to limit embodiments and/or application or uses of embodiments. Furthermore, there is no intention to be bound by any expressed or implied information presented in the preceding sections, or in the Detailed Description section.

One or more example embodiments are now described with reference to the drawings, in which example components, graphs and/or operations are shown, and in which like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details, and that the subject disclosure may be embodied in many different forms and should not be construed as limited to the examples set forth herein.

FIG. 1 is a representation of an example system 100 including a quantum processing unit 102 coupled to a computing device 104 such as a classical computer (wherein in general, classical computer refers to a commercially available, non-quantum computer system). In general, the quantum processing unit 102 includes a quantum circuit 106 (e.g., quantum gates, qubit state setting and the like) coupled to a qubit 108; (typically a quantum computer has many qubits, although for purposes of explanation herein sensing the state of a single qubit 108 is described).

A number of rf-SQUIDS (collectively labeled 110) are distributed along a control line 112, between a superconducting quantum circuit wire (SQCW) 114 corresponding to a send path and a SQCW 116 corresponding to a return path. As described herein, the rf-SQUIDS monitor the states of the qubit 108, and, via inductive coupling to a control line/detection wire 112, which carries a relatively low power radio frequency (RF) signal as described herein, provides monitoring data (e.g., management flux, inductance and/or phase shift) to the computing device 104. The use of a low-power RF signal aids in detecting phase shift data without adding load or noise to the SQCW wires 114 or 116.

Logic 118, running via a processor 120 and memory 122 of the computing device 104, processes the monitoring data as described herein to determine whether a qubit state transition occurred. If so, the logic 118 informs the quantum circuit 106 of the state change, providing a feedback loop by which the quantum circuit 106 can adjust the qubit states. Note that a quantum processor can apply specific microwave control pulses to manipulate the state of individual qubits, fine-tuning their quantum properties (e.g., phase, amplitude, and timing) to ensure accurate computations. This mitigates errors caused by environmental noise, resulting in the desired quantum state for the computation by calibrating each qubit's parameters.

In one implementation, an interface 124, such as implemented in a PCIe (peripheral component interconnect express) accelerator card or the like, can perform the read out of the monitoring data, and/or the output of the low-power RF signal to the control line (detection wire) 112. This facilitates precise, real-time monitoring and feedback for improved system stability and fidelity in quantum operations. Note that some or all of the logic 118 can run on such an accelerator card.

Figure 2:
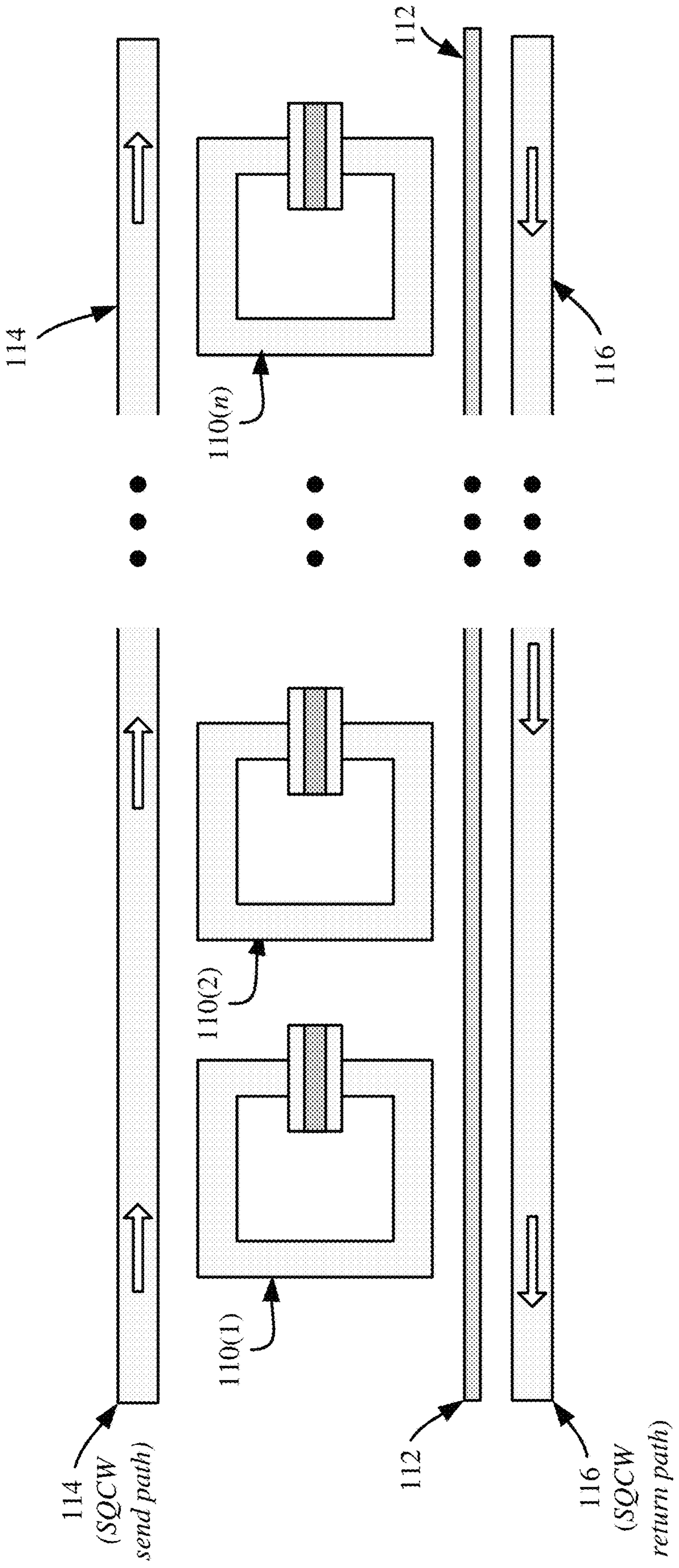
FIG. 2 is cross-sectional view representation showing a number of rf-SQUIDS positioned between superconducting quantum circuit wires and coupled to a control line/detection wire, in accordance with various example embodiments and implementations of the subject disclosure.

FIG. 2 shows a cross-section of a group of distributed rf-SQUIDS 110(1)-110(*n*) aligned between the SQCW 114 and the SQCW 116. The return path can be a shared ground plane for the quantum circuit, or a return path for feedback or simply for qubit return. The control line/detection wire 112 is shown as between the distributed rf-SQUIDS 110(1)-110(*n*) and the SQCW 116 (return path), although it is feasible to have the control line/detection wire 112 positioned between the distributed rf-SQUIDS 110(1)-110(*n*) and the SQCW 14 (send path).

Figure 3:
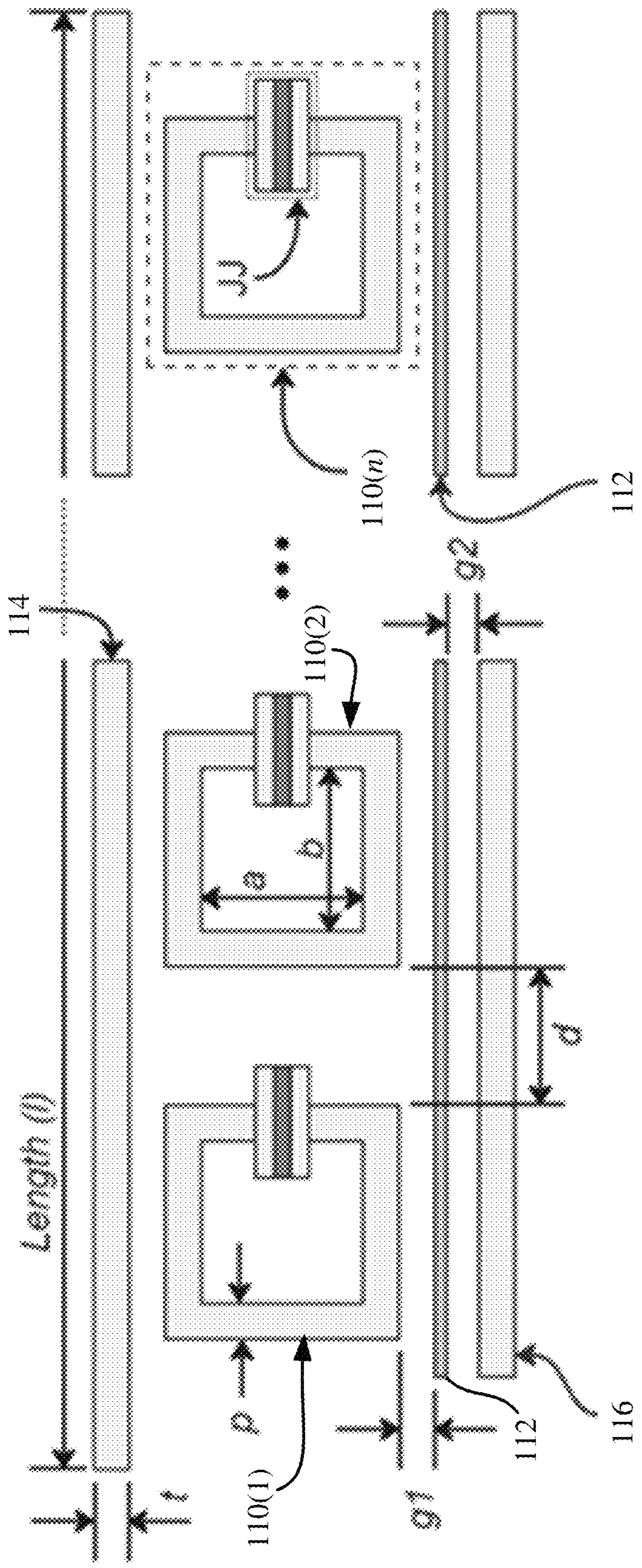
FIG. 3 is a cross-sectional view representation showing various dimensions of the rf-SQUIDS and control line design of FIG. 2, in accordance with various example embodiments and implementations of the subject disclosure.

FIG. 3 shows various dimensions for the cross-section of the group of rf-SQUIDS 110(1)-110(*n*) aligned between the SQCW 114 and the SQCW 116. Note that the label "JJ" in the rf-SQUID 110(*n*) represents a Josephson junction as described herein.

In one example implementation, the radio frequency (RF) signal, typically between 8-10 GHz for high frequency quantum systems, or less than 1 GHz for low frequency systems, passes through a fixed length (l) of SQCWs 114 and 116, which is magnetically coupled to an array of rf-SQUIDs 110(1)-110(*n*) along its length as shown in FIG. 3. The rf-SQUIDs 110(1) 110(*n*) have the loop width (p) and the internal loop length (a) and loop width (b). The rf-SQUIDs 110(1)-110(*n*) are placed close to the primary SQCW 114 and shared SQCW 116 with a distance/gap (g1) with SQCW having the thickness (t).

The control line (detection wire) 112 is placed between one of the SQCWs (in this example, the shared (return path) SQCW 116) with a gap distance (g1) between the control line 112 and each rf-SQUID (g1), and a gap distance (g2) between the control line 112 and the SQCW 116. The control line 112 can be placed between the primary SQCW 114 (or the shared or secondary SQCW 116 as shown in FIG. 3).

The rf-SQUIDs 110(1)-110(*n*) are distributed with a distance (d). In general such a design does not add any interference and does not need any additional compute or signal sources and detectors because of the shared control line 112 running parallel to the circuit and rf-SQUIDs 110(1)-110(*n*). The classical computer only needs to output a low-power RF signal to the control line 112 and read the signal to monitor the phase shift change for the detection of decoherence and entanglement.

Figure 4:
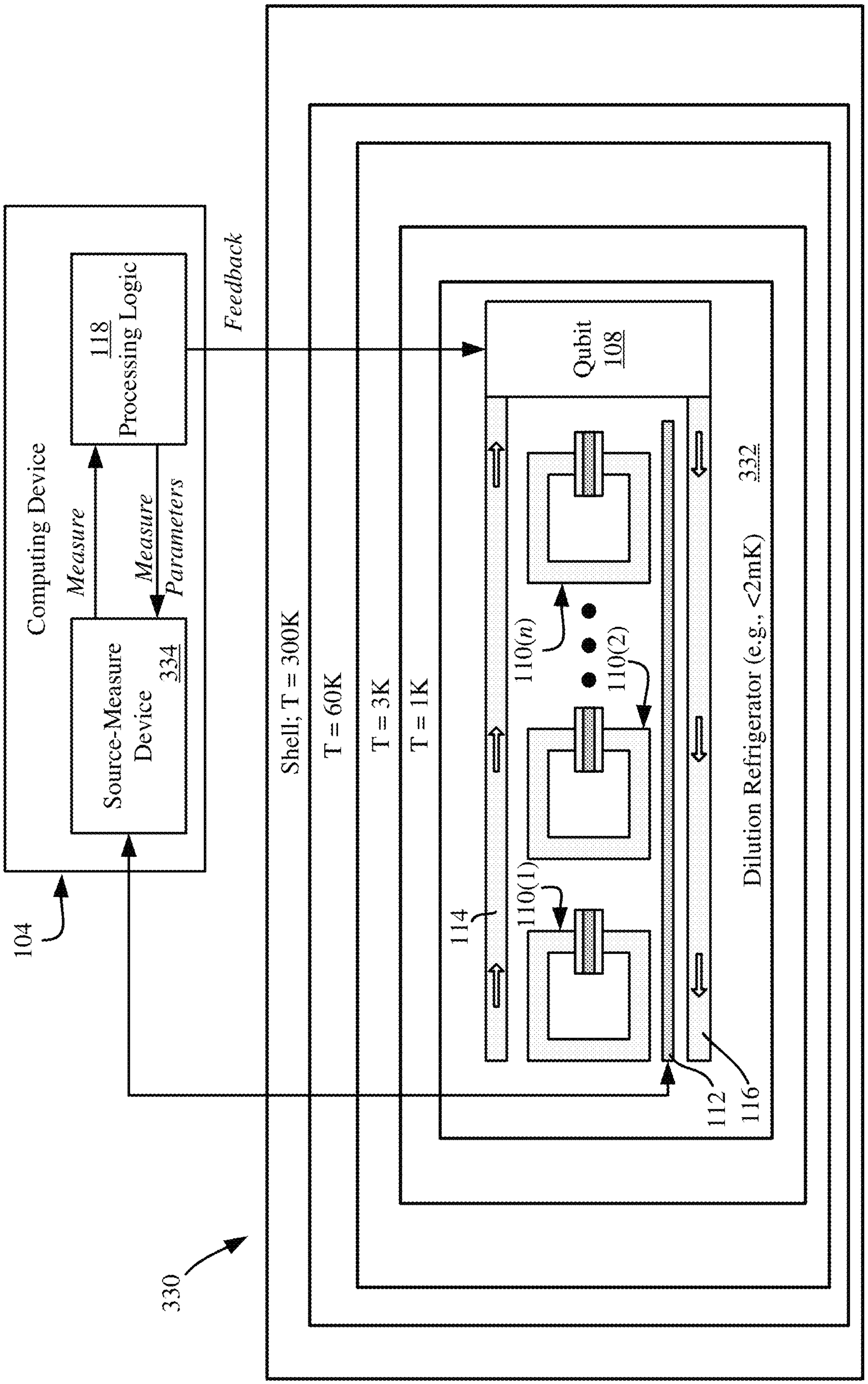
FIG. 4 is a block diagram representation of an example system in which a qubit circuit in a dilution refrigerator is connected via superconducting quantum circuit wires that are sensed by rf-SQUIDS inductively coupled to a radio frequency-based control wire/detection line, in accordance with various example embodiments and implementations of the subject disclosure.

FIG. 4 shows the (cross section) group of distributed rf-SQUIDS 110(1)-110(*n*) in a dilution refrigerator 332 portion of a quantum computer 330 coupled to a computing device 104 as described herein. Example temperatures are shown in degrees Kelvin (K) for various levels of the quantum computer 330, ranging from generally room temperature to milli-Kevins in the dilution refrigerator 332. In this example, the computing device includes a source-measure device 334, e.g., in the PCIe accelerator card, that sources and measures the RF signal on the RF control line 112.

To summarize thus far, there is described herein a distributed detection network that operates by utilizing a number of rf-SQUIDs placed at pre-determined distance (d) along the SQCWs, optimizing the detection of qubit entanglement, decoherence, and state changes. This facilitates detecting the qubit state without adding any interference or noise to the quantum circuit (e.g., through any additional current from a classical computer) by integrating a control line (detection wire) between rf-SQUIDs and a SQCW. The detection system is scalable, being independent of the number of rf-SQUIDs introduced in the quantum circuit.

In general, the detection system leverages the sensitivity of rf-SQUIDs to detect changes in the magnetic flux and inductance associated with qubit states. The rf-SQUIDs are strategically placed along the superconducting quantum circuit wire (SQCW) to monitor qubit states dynamically. This allows for real-time detection of qubit state changes, providing immediate feedback for error correction.

Magnetic flux through a superconducting loop, such as an rf-SQUID, is quantized in units of the flux quantum $\Phi_0$:

$$\Phi_0 = \frac{h}{2e} \approx 2.07 \times 10^{-15}\ \text{Wb}$$

where h is Planck's constant and e is the electron charge. The total magnetic flux $\Phi$ in a superconducting loop can be expressed as:

$$\Phi = n\Phi_0 + LI$$

where n is an integer, L is the inductance of the loop, and l is the current through the loop. The rf-SQUID's ability to detect changes in magnetic flux allows it to monitor the qubit state transitions accurately.

The inductance of the rf-SQUID, $L_s$, changes with the current passing through it. This inductance variation can be represented as:

$$\phi_L = -LI_0 \sin\left(\frac{2\pi\phi_T}{\Phi_0}\right)$$

where $\phi_L$ is the induced flux, $I_0$ is the critical current, and $\phi_T$ is the total flux through the rf-SQUID. This relationship shows how the inductance, and the total flux are interdependent, allowing the rf-SQUID to detect small changes in the qubit state.

The current through the rf-SQUID, $I_s$, is also a function of the total flux and is given by:

$$I_s = -I_0 \sin\left(\frac{2\pi\phi_T}{\Phi_0}\right)$$

This equation highlights how the current in the rf-SQUID varies with the total flux, which can be monitored to detect changes in the qubit state.

The phase shift $\delta$ in the rf-SQUID can be detected using the following relationship:

$$\delta + \frac{2\pi\phi_T}{\Phi_0} = 2\pi n$$

where $\delta$ is the phase shift, $\phi_T$ is the total flux, and n is an integer. This equation is fundamental for detecting changes in phase coherence, which is needed for maintaining qubit stability.

The dynamic inductance $L_{dyn}$ of the rf-SQUID changes with the current passive through it and is given by:

$$L_{dyn} = L_s + \frac{L}{2\pi} \cos\left(\frac{2\pi\phi_T}{\Phi_0}\right)$$

This equation shows how the dynamic inductance varies with the total flux and provides a direct measure of qubit state changes.

The relation between the current and phase in the rf-SQUID is described by:

$$\frac{d\delta}{dt} = \frac{2\text{ eV}}{\hbar} = \frac{2\pi V}{\Phi_0}$$

This relationship shows how phase changes affect the current in the rf-SQUID, which can be used to detect qubit state transitions.

Figure 5:
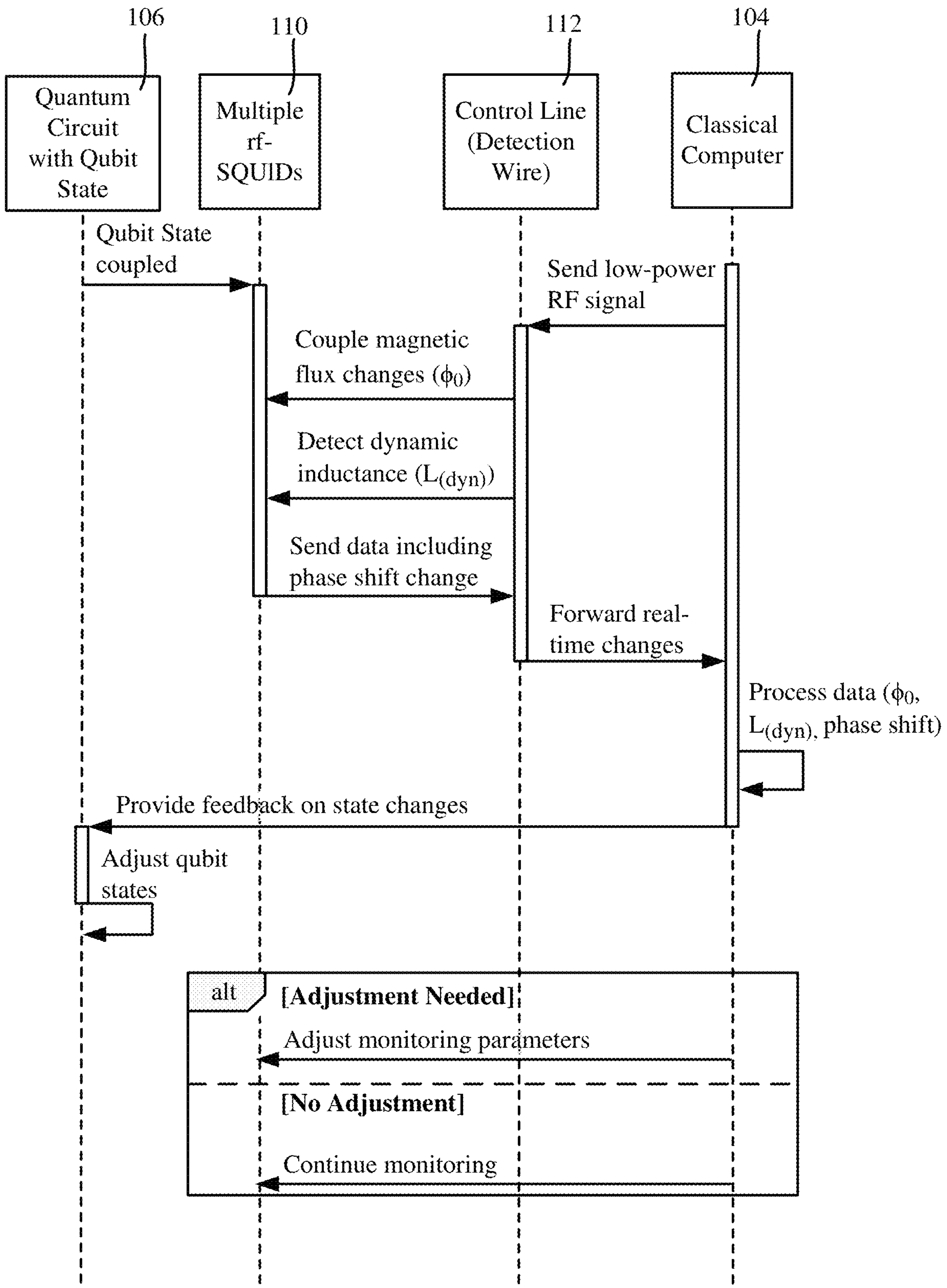
FIG. 5 is a sequence diagram of example component interaction with respect to qubit sensing and feedback from a computing device, in accordance with various example embodiments and implementations of the subject disclosure.

The sequence diagram shown in FIG. 5 illustrates the interaction between a quantum circuit 106, multiple rf-SQUIDs 110, a control line 112, and a classical computer 104 for real-time monitoring and adjustment of qubit states. Initially, the qubit states from the quantum circuit 106 are coupled to the rf-SQUIDs, enabling them to detect changes in magnetic flux and dynamic inductance. The classical computer 104 initiates the monitoring process by sending a low-power rf signal through the control line 112, which interacts with the rf-SQUIDs 110 to couple these magnetic flux changes and detect dynamic inductance. The rf-SQUIDs 110 measure these changes and detect phase shift changes, sending this monitoring data ($\phi_0$, $L_{(dyn)}$, phase shift) back to the control line 112.

In turn, the control line 112 forwards the real-time monitoring data on magnetic flux, inductance, and phase shifts to the classical computer 104, which processes this information to detect any changes in the qubit states. If a state change is detected, the classical computer 104 provides feedback to the quantum circuit 106, enabling the quantum circuit 106 to adjust the qubit states as necessary. If adjustments are needed, the classical computer 104 sends new monitoring parameters to the rf-SQUIDs; otherwise, the classical computer 104 continues monitoring. This generally continuous monitoring and feedback loop ensures high-fidelity and stability in quantum operations, leveraging the precision of the rf-SQUIDs 110 and the processing power of the classical computer 104.

Such an enhanced qubit state monitoring for hybrid quantum-classical computer system is thus based on deploying multiple rf-SQUIDs distributed across the superconducting quantum circuit wires (SQCW), distributed with a distance (d) in the quantum computer, e.g., across significant areas. The enhanced qubit state monitoring technique makes use of the Josephson inductance approach.

Note that in the absence of rf-SQUIDs, the SQCW has a fixed capacitance per unit length (C) and a fixed inductor per unit length (L). The small signal wave velocity of a SQCW is given by:

$$v = 1/\sqrt{(L \cdot C)}$$

As described herein, rf-SQUIDs are placed between the primary SQCW and shared or bottom SQCW. Each rf-SQUID has one Josephson junction (JJ) shunted by an inductive superconductive loop. A Josephson junction (JJ) is a fundamental component in superconducting quantum circuits, made from two superconductors separated by a thin insulating barrier. When a current flows through the junction, the current can tunnel through the insulator without any voltage drop, a phenomenon known as the Josephson effect. A rf-SQUID (as well as a dc-SQUID, not described herein), combines the physical phenomenon of flux quantization and Josephson tunneling.

Figure 6:
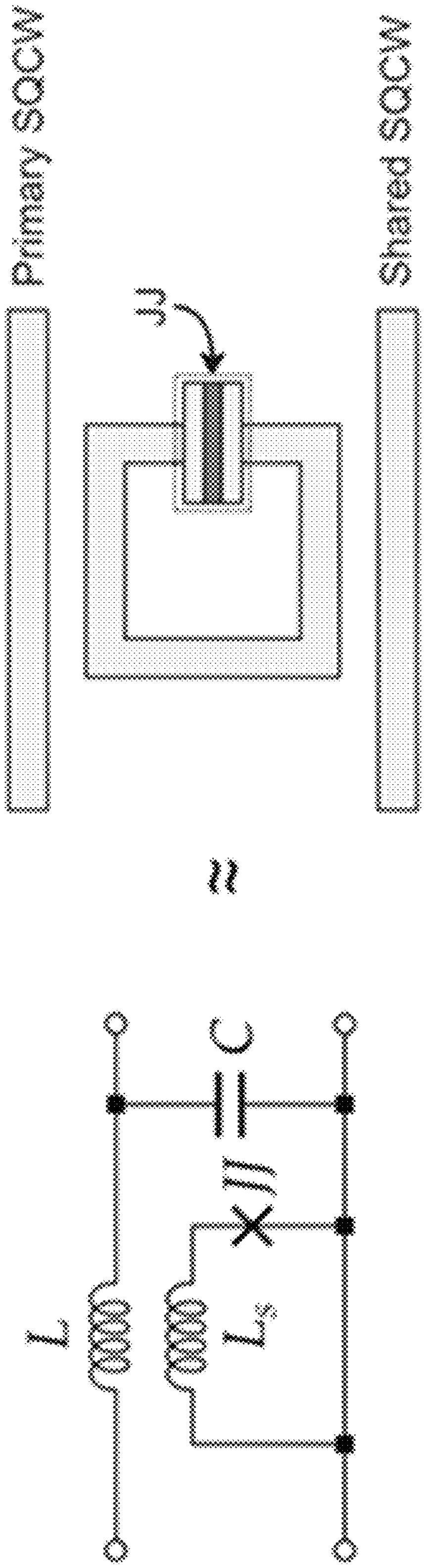
FIG. 6 is a representation of an example equivalent circuit of a superconducting quantum circuit wire unit-cell containing an rf-SQUID also showing a cross-section view of an rf-SQUID placed between a primary and shared superconducting quantum circuit wire, in accordance with various example embodiments and implementations of the subject disclosure.

The length of the line containing one SQUID is much shorter than the RF wavelength. Each rf-SQUID is a superconducting loop extending on two metal layers shunted by interconnects on one end and JJ on the other end as shown in the right portion FIG. 6. The equivalent circuit of a SQCW section coupled to a rf-SQUID is shown in the left portion of FIG. 6.

Figure 7:
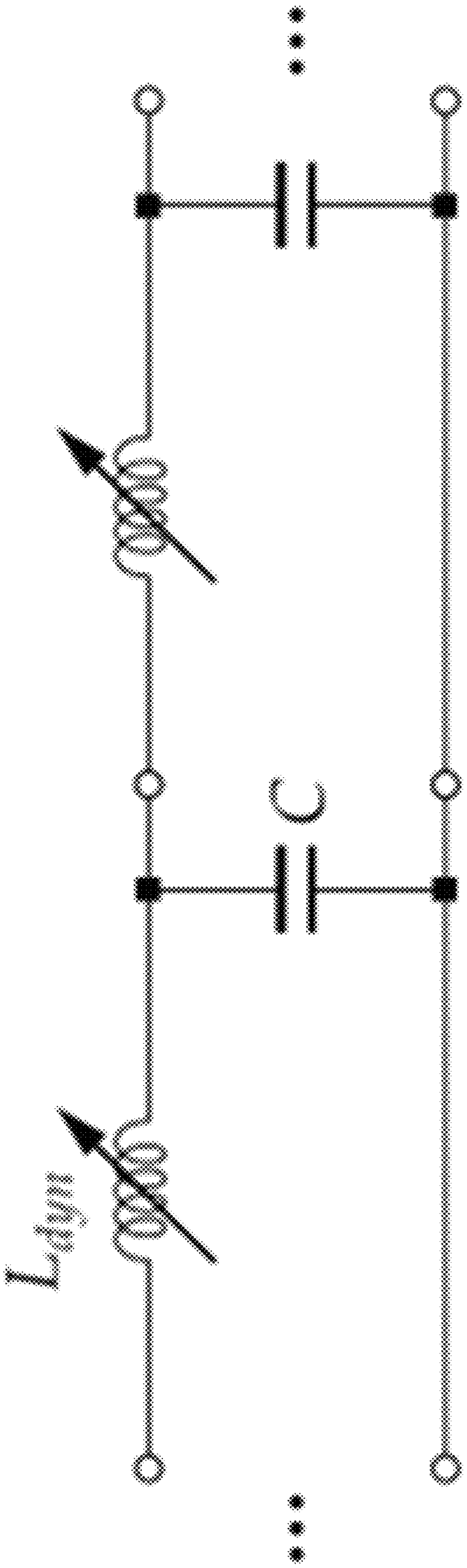
FIG. 7 is a representation of an example lumped element model of a qubit state detector circuit with two unit-cell equivalents depicted, in accordance with various example embodiments and implementations of the subject disclosure.
Figure 8:
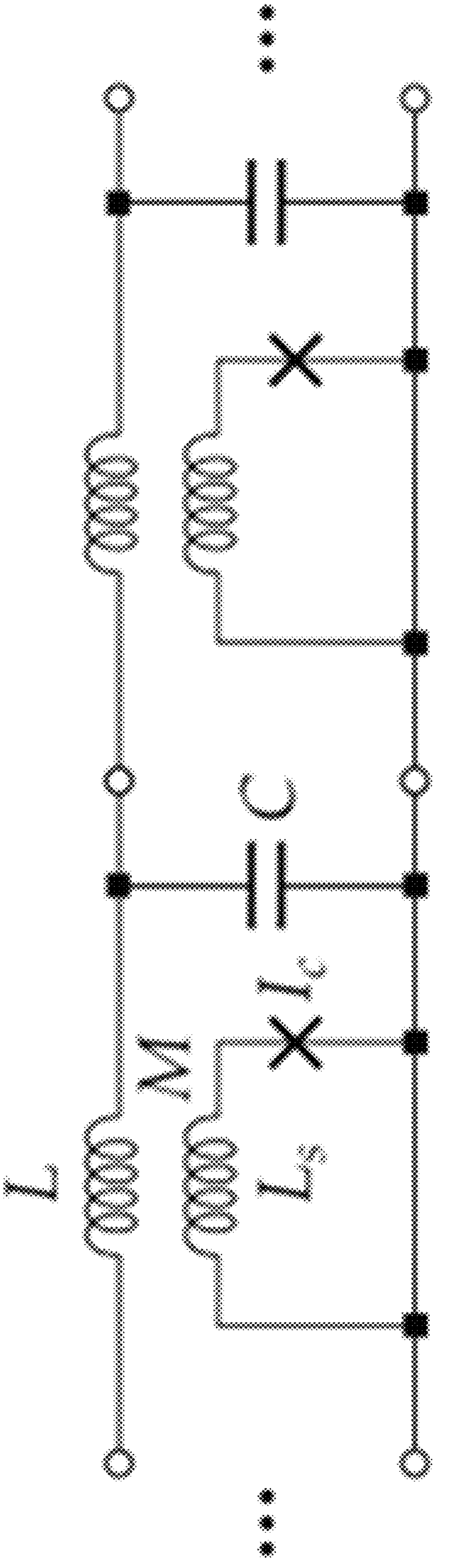
FIG. 8 is an example top view representation of an example small signal RF equivalent circuit for qubit state detection, in accordance with various example embodiments and implementations of the subject disclosure.

The magnetic coupling of the SQCW to an array of rf-SQUIDs leads to a dynamic inductance per unit length ($L_{dyn}$) as shown in FIG. 7. A small signal RF equivalent circuit of the quantum state detection portion of the qubit state monitoring and detection system is shown in FIG. 8. As a result, coupling a relatively large number of rf-SQUIDs to a SQCW creates a variable magnetic medium in which wave velocity can be controlled electronically, $$v = 1/\sqrt{(L_{dyn} \cdot C)}$$

The change in wave velocity and hence the phase delay in the SQCW is achieved by increasing the power of the RF signal, which provides an equivalent rf current $I_{rf}$. Note that the phase shift at the output can also be achieved through the application of an external magnetic field, with the magnet oriented so that its field passes through the SQUID loops. In contrast, the technology described herein is based on using RF power for controlling the output signal phase (although it is feasible to have some magnetic assistance).

Turning to the dynamic inductance in terms of the phase of the SQUIDs and the electrical parameters of the SQCW, each SQCW unit-cell has a series inductance, L, and a shunt capacitance, C. The series inductance L of the SQCW cell is coupled to a single SQUID loop through a mutual inductance, M. The rf-SQUID loop is a superconducting loop with inductance, $L_s$, and a Josephson tunnel junction. The expression for the dynamic inductance of the rf-SQUID coupled SQCW is derived below.

The flux through the inductor, L, and $L_s$ is given as $\Phi$, and $\Phi_s$, respectively. The flux through these inductors is related to the current through the two inductors by:

$$\begin{bmatrix} \Phi \\ \Phi_s \end{bmatrix} = \begin{bmatrix} L & M \\ M & L6 \end{bmatrix} \begin{bmatrix} I \\ I_s \end{bmatrix}$$

$$\Phi = LI + MI_s$$

$$\Phi_s = MI + L_s I_s$$

where L is the self inductance per cell of the SQCW, $L_s$ is the self-inductance of the SQUID, and M is the mutual inductance between the SQCW and one SQUID. I represents the current running through the SQCW section and is controlled externally, while $I_s$ depends on the operating point of the SQUID.

According to the well-known Josephson relation:

$$I_s = I_c \sin\theta$$

where $I_c$ is the critical current of the JJ and θ is the phase of the SQUID.

The phase of the SQUID, θ is expressed as:

$$\theta = -\frac{2\pi\Phi_s}{\Phi_0}$$

where $\Phi_0$ is the flux quantum ($\Phi_0$=2.0679×$10^{-15}$ Wb). The negative sign reflects the fact that as/increases from zero, $\Phi_s$ initially opposes Φ.

Substituting $I_s$=$I_c$ sin θ in Φ=LI+$MI_s$ and in $\Phi_s$=MI+$L_sI_s$ gives $$\Phi = LI + MI_c\sin\theta$$

$$\Phi_s = MI + L_sI_c\sin\theta$$

To find $\Phi_s$ from θ:

$$\Phi_s = -\frac{\theta\Phi_0}{2\pi}$$

Using the value of $\Phi_s$, of $\Phi_s$=MI+$L_sI_c$ sin θ

$$-\frac{\theta\Phi_0}{2\pi} = MI + L_sI_c\sin\theta$$

$$-\theta = \frac{2\pi}{\Phi_0}MI + \frac{2\pi}{\Phi_0}L_sI_c\sin\theta$$

$$\frac{2\pi MI}{\Phi_0} = -\theta - \frac{2\pi L_sI_c}{\Phi_0}\sin\theta$$

The factor ($2\pi L_sI_c/\Phi_0$) is the screening parameter (also called SQUID parameter), β.

$$\frac{2\pi M1}{\Phi_0} = -\theta - \beta\sin\theta$$

$$\theta = -2\pi\left(\frac{MI}{\Phi_0}\right) - \beta\sin\theta$$

The dynamic inductance is defined by:

$$L_{dyn} = \frac{d\Phi}{dI}$$

Differentiating $\Phi_s$=MI+$L_sI_c$ sin θ with respect to I gives:

$$\frac{d\Phi}{dI} = L + MI_c\cos\theta\left(\frac{d\theta}{dI}\right)$$

Differentiating $$\theta = -2\pi\left(\frac{MI}{\Phi_0}\right) - \beta\sin\theta$$

with respect to I gives:

$$\frac{d\theta}{dI} = \frac{-\frac{2\pi m}{\Phi_0} - \beta\cos\theta\left(\frac{d\theta}{dI}\right)}{1 + \beta\cos\theta}$$

$$\frac{d\theta}{dI} = \frac{-\frac{2\pi m}{\Phi_0}}{1 + \beta\cos\theta}$$

$$\frac{d\theta}{dI} = \frac{-\frac{2\pi m}{\Phi_0}}{\Phi_0(1 + \beta\cos\theta)}$$

Substituting the above equations in $$\frac{d\Phi}{dI} = L + MI_c\cos\theta\left(\frac{d\theta}{dI}\right):$$

$$L_{dyn} = \frac{d\Phi}{dI} = L + MI_c\cos\theta\left(-\frac{2\pi M}{\Phi_0(1 + \beta\cos\theta)}\right)$$

$$L_{dyn} = L - \frac{2\pi M^2 I_c\cos\theta}{\Phi_0(1 + \beta\cos\theta)}$$

The mutual coupling, M, between the two inductors L and $L_s$ is related by:

$$k^2 = \frac{M^2}{LL_s}$$

$$M^2 = k^2LL_s$$

Substituting $M^2$=$k^2LL_s$ in $$L_{dyn} = L - \frac{2\pi M^2 I_c\cos\theta}{\Phi_0(1 + \beta\cos\theta)}$$

$$L_{dyn} = L - \frac{2\pi k^2 LL_sI_c\cos\theta}{\Phi_0(1 + \beta\cos\theta)}$$

Substituting the SQUID parameter, β

$$L_{dyn} = L - \frac{k^2\beta L\cos\theta}{1 + \beta\cos\theta}$$

Hence, the dynamic inductance $L_{dyn}$ of a SQCW cell coupled to a rf-SQUID is:

$$L_{dyn} = L\left(1 - \frac{k^2\beta\cos\theta}{1 + \beta\cos\theta}\right)$$

Hence, the phase θ of the SQCW of length l coupled with an array of rf-SQUIDs is given by:

$$\Theta = \omega\sqrt{L_{dyn} C \times l_{tot}}$$

The phase control is achieved using rf power. The dynamic inductance of the SQCW and the output phase shift by varying the rf power from −30 dBm to 10 dBm through a PCIe based accelerator card in a classical computer.

The rf current, $I_{rf}$ is computed from the rf power, $P_{rf}$ using:

$$I_{rf} = \sqrt{P_{rf}/Z_0}$$

ference devices (rf-SQUIDs) coupled to qubit states of a quantum circuit associated with a qubit, the group of rf-SQUIDs positioned between a first superconducting quantum circuit wire corresponding to a send path to the quantum circuit, and a second superconducting quantum circuit wire corresponding to a return path from the quantum circuit. The system can include a control line adjacent to the group of distributed rf-SQUIDs, the control line configured to: carry a radio frequency signal generated by a computing device to generate magnetic flux that couples with the group of rf-SQUIDs, and return monitoring data, comprising at least one of: magnetic flux data representative of a magnitude of the magnetic flux, dynamic inductance data representative of a dynamic inductance of the magnetic flux, or phase shift data representative of a phase shift of the magnetic flux, to the computing device.

| RF Power $P_{rf}$ (dBm) | RF Power $P_{rf}$ (W) | RF Current $I_{rf}$ (A) | rf-SQUID θ (°) | Phase cos θ | Dynamic Inductance $L_{dyn}$ (H) | $\sqrt{L_{dyn} \times C}$ | Relative Phase Shift Θ (°) |
|---|---|---|---|---|---|---|---|
| −30 | 1.00e−6 | 1.32e−4 | 1.65 | 0.999 | 1.096e−11 | 2.332e−13 | 0.00 |
| −25 | 3.16e−6 | 2.34e−4 | 3.40 | 0.998 | 1.097e−11 | 2.333e−13 | 0.01 |
| −20 | 1.00e−5 | 4.16e−4 | 8.54 | 0.989 | 1.099e−11 | 2.336e−13 | 0.05 |
| −15 | 3.16e−5 | 7.41e−4 | 18.89 | 0.946 | 1.112e−11 | 2.349e−13 | 0.23 |
| −10 | 1.00e−4 | 1.32e−3 | 40.17 | 0.764 | 1.172e−11 | 2.412e−13 | 1.12 |
| −5 | 3.16e−4 | 2.34e−3 | 83.14 | 0.119 | 1.534e−11 | 2.760e−13 | 6.06 |
| 0 | 1.00e−3 | 4.16e−3 | 251.97 | −0.309 | 2.121e−11 | 3.245e−13 | 12.93 |
| 5 | 3.16e−3 | 7.41e−3 | 566.58 | −0.894 | 7.873e−11 | 6.252e−13 | 55.55 |
| 10 | 1.00e−2 | 1.32e−2 | 357.80 | −0.999 | 2.099e−10 | 1.021e−12 | 111.63 |

This linked flux results in a change in the phase of the SQUID, thereby altering the dynamic inductance of the transmission line that is used for detecting and monitoring the qubit state. The output current can be controlled using a classical computer with a PCIe-based accelerator card that can provide digital to analog conversion for current detection and source. For instance, various vendors offer commercially available solutions that can offer source-measure unit and oscilloscope module integrated into a single-slot PCIe card.

Figure 9A:
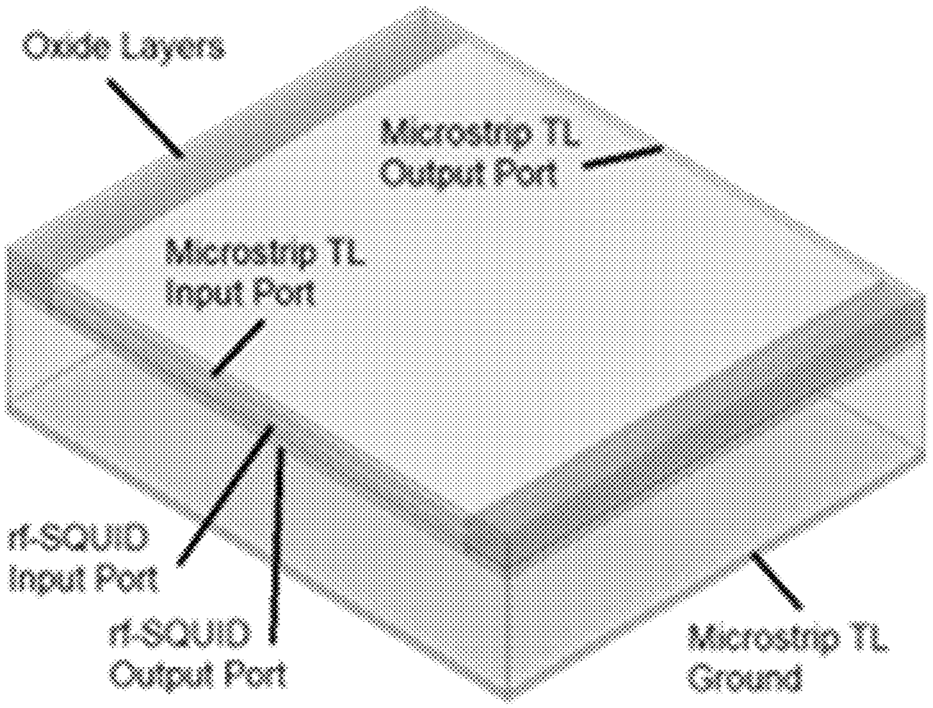
FIG. 9A is a three-dimensional view of an example RF-SQUID used in simulation measurements, in accordance with various example embodiments and implementations of the subject disclosure.
Figure 9B:
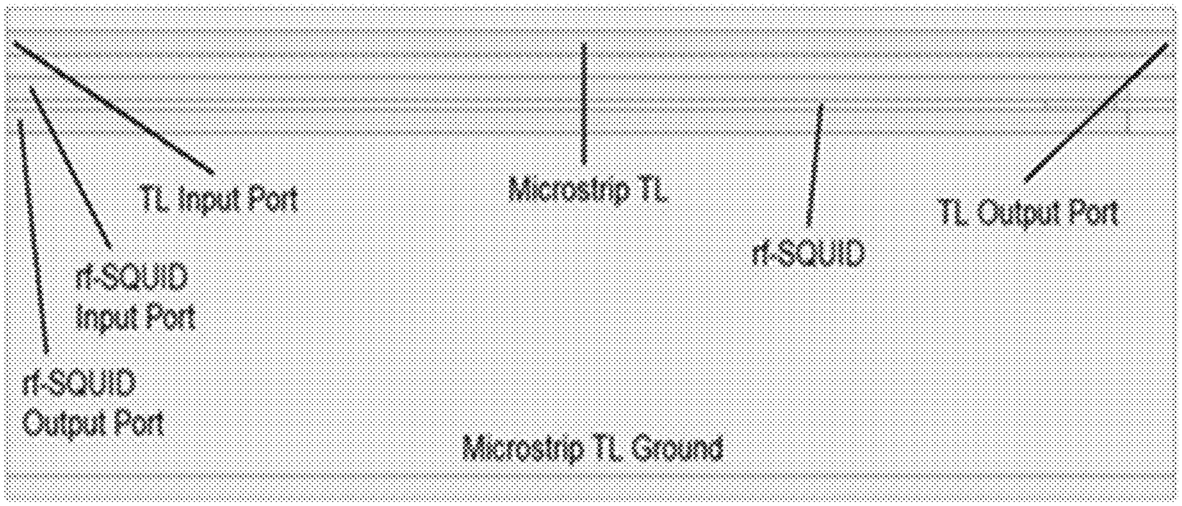
FIG. 9B is a cross-sectional view of the example RF-SQUID of FIG. 9A, in accordance with various example embodiments and implementations of the subject disclosure.
Figure 10A:
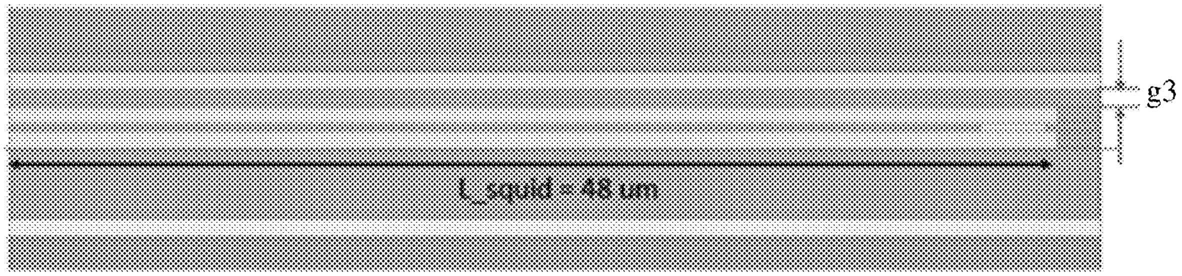
FIG. 10A is a cross-sectional view of the example RF-SQUID of FIG. 9B showing one suitable length of the RF-SQUID and the relative gap distance between the superconducting quantum circuit wire and the rf-SQUID, in accordance with various example embodiments and implementations of the subject disclosure.

An rf-SQUID model was designed in ANSYS MAXWELL to simulate the magnetic flux change and equivalent dynamic inductance change to prove the concept. FIG. 9A shows a 3D view of the rf-SQUID designed for simulation. The cross-section view of the rf-SQUID is depicted in FIG. 9B. FIG. 10A shows a close-up view highlighting the gap distance g3 between SQCW and rf-SQUID and the total length L_squid (48 μm) of the rf-SQUID loop used for simulation.

Figure 10B:
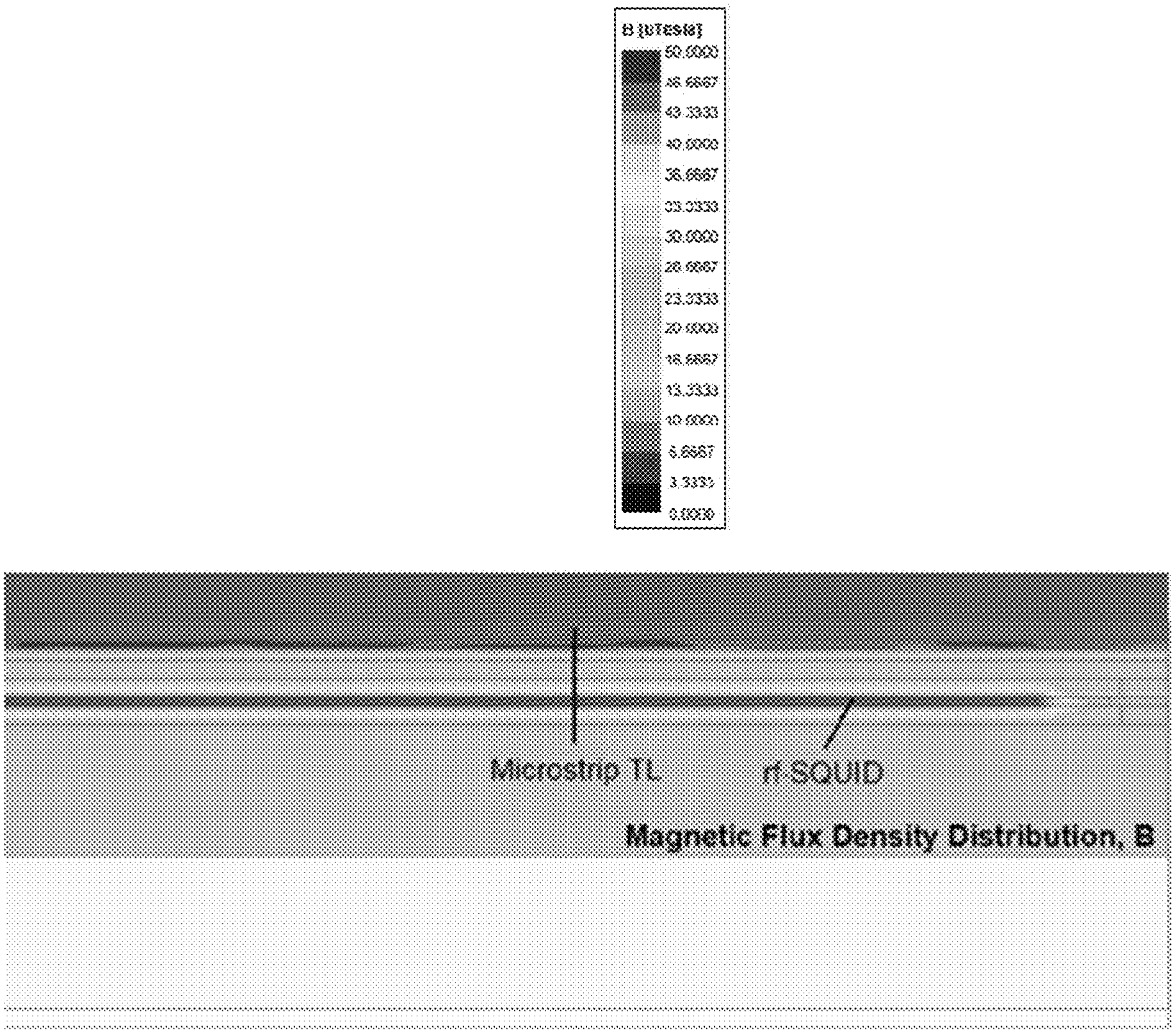
FIG. 10B is a cross-sectional view showing magnetic flux generation between the superconducting quantum circuit wire and the rf-SQUID, in accordance with various example embodiments and implementations of the subject disclosure.

Simulations were carried out in the industry standard ANSYS MAXWELL software to capture the magnetic flux with applied RF power to the control line. The simulator solved the partial differential equations and Maxwell equations to compute the electric and magnetic fields, including magnetic flux, and is a finite element solver. The simulations were carried out using tetrahedral mesh. The change in the magnetic flux with applied current is shown in FIG. 10B.

Figure 11A:
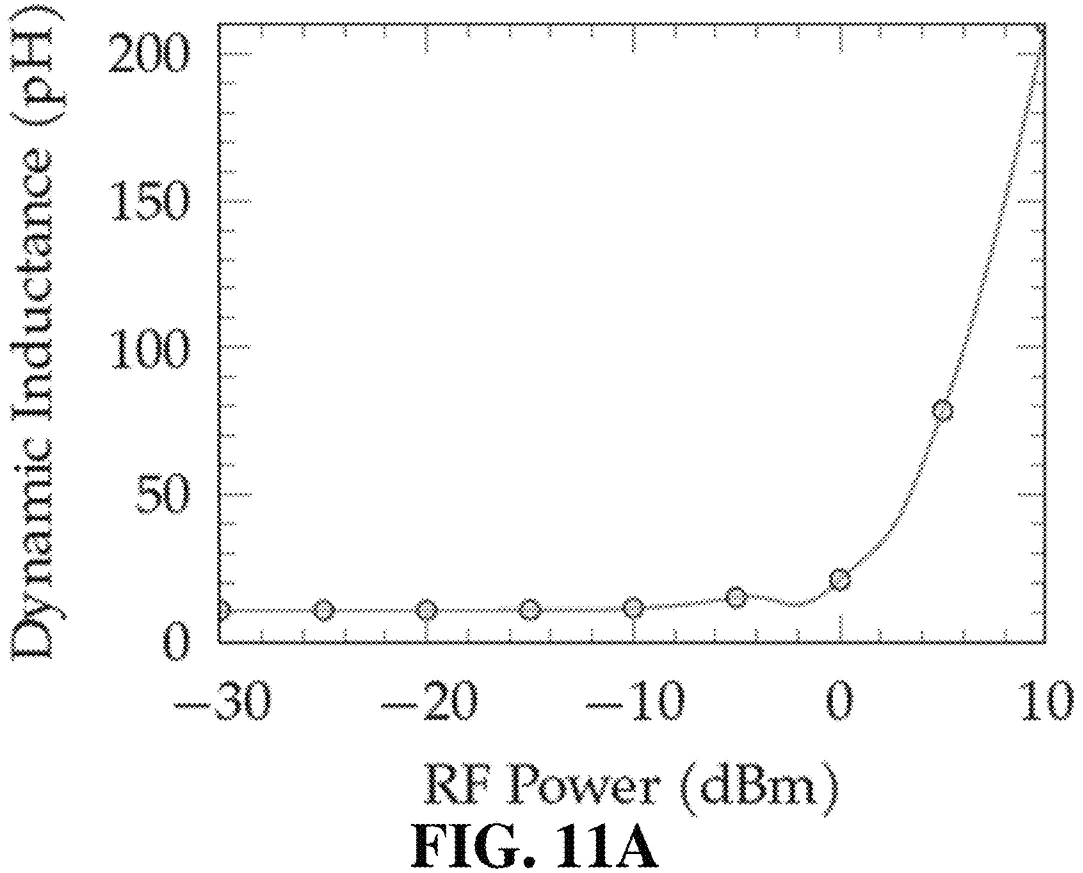
FIG. 11A is a graphical representation of example simulation results highlighting sensed change in inductance with applied RF power to the control line, in accordance with various example embodiments and implementations of the subject disclosure.
Figure 11B:
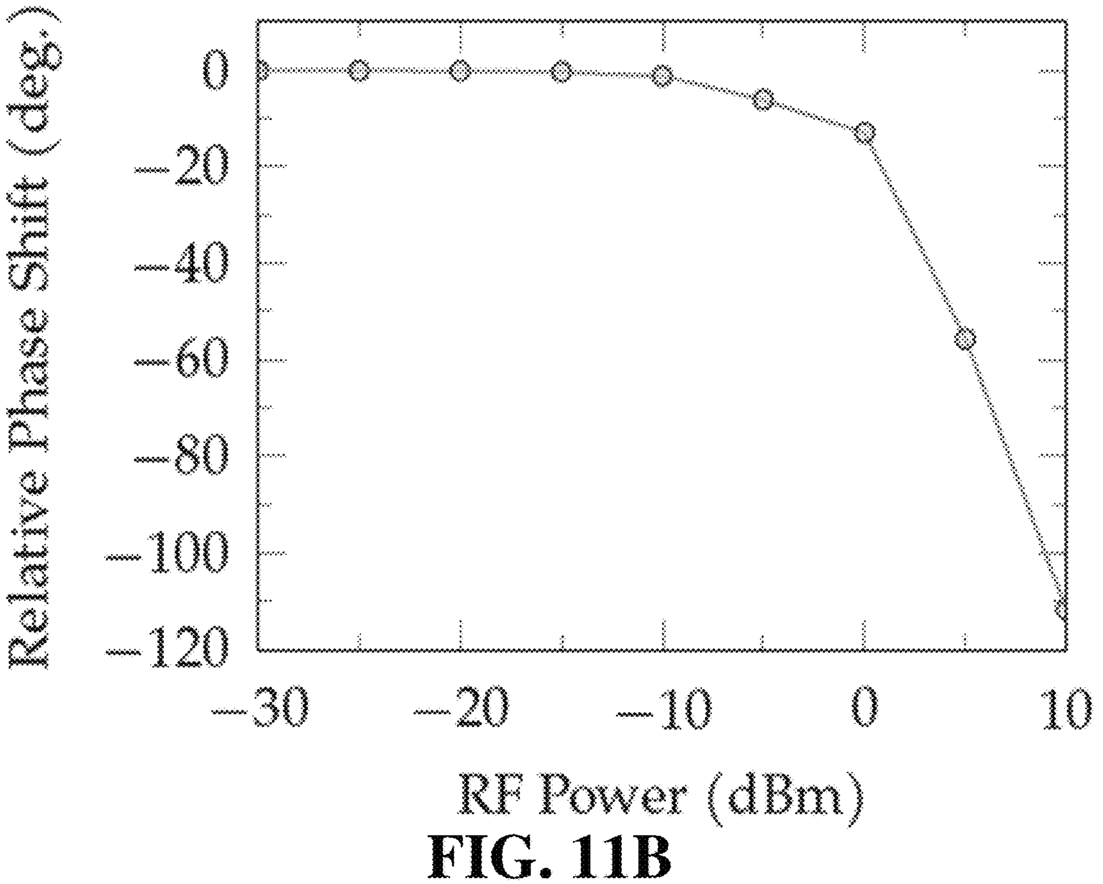
FIG. 11B is a graphical representation of example simulation results highlighting sensed change in relative phase shift change with applied RF power to the control line, in accordance with various example embodiments and implementations of the subject disclosure.

The dynamic inductance change with change in RF power is shown in FIG. 11A. Respective relative phase shift response is simulated as illustrated in FIG. 11B.

One or more implementations and embodiments can be embodied in a system, such as described and represented in the example herein. The system can include a group of distributed radio frequency-superconducting quantum interference devices (rf-SQUIDs) coupled to qubit states of a quantum circuit associated with a qubit, the group of rf-SQUIDs positioned between a first superconducting quantum circuit wire corresponding to a send path to the quantum circuit, and a second superconducting quantum circuit wire corresponding to a return path from the quantum circuit.

The group of rf-SQUIDs can be distributed between the first superconducting quantum circuit wire and the second superconducting quantum circuit wire at substantially even distances from one another.

Based on the monitoring data, the computing device can communicate feedback to a quantum processor for state adjustment of the qubit.

The feedback can indicate a qubit state change. The qubit state change can indicate decoherence of the qubit. The qubit state change can indicate entanglement of the qubit. The qubit state change can indicate superposition collapse of the qubit.

Based on the monitoring data, the computing device can adjust monitoring parameter data associated with the group of rf-SQUIDs. The monitoring parameter data can include a current of the radio frequency signal. The monitoring parameter data can include a frequency of the radio frequency signal.

The computing device can be coupled to the control line via a peripheral component interconnect express card.

The control line can be proximate to the first superconducting quantum circuit wire.

The control line can be proximate to the second superconducting quantum circuit wire.

Figure 12:
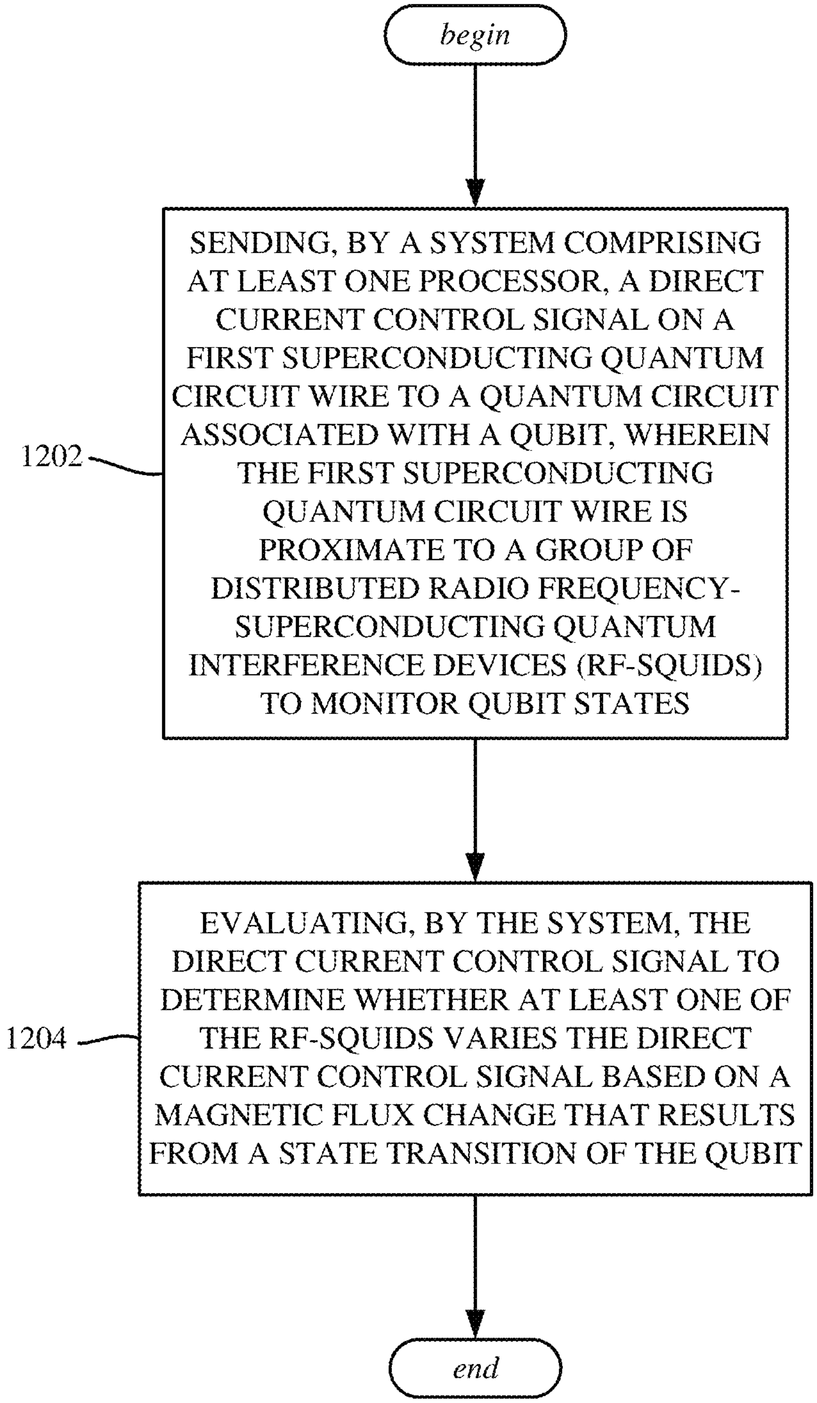
FIG. 12 is a flow diagram showing example operations related to sending and receiving an RF signal on a control line to obtain qubit state monitoring data, in accordance with various example embodiments and implementations of the subject disclosure.

One or more example implementations and embodiments, such as corresponding to example operations of a method, are represented in FIG. 12. Example operation 1202 represents sending, by a system comprising at least one processor, a radio frequency signal on a control line, the control line coupled by the radio frequency signal to a group of distributed radio frequency-superconducting quantum interference devices (rf-SQUIDs); the group of distributed rf-SQUIDs is positioned between a first superconducting quantum circuit wire corresponding to a send path to a quantum circuit associated with a qubit, and a second superconducting quantum circuit wire corresponding to a return path from the quantum circuit, and wherein the rf-SQUIDs of the group of distributed rf-SQUIDs are coupled to qubit states of a quantum circuit associated with a qubit. Example operation 1204 represents receiving, by the system via the control line, qubit state monitoring data comprising at least one of: magnetic flux data, dynamic inductance data, or phase shift data, sensed by the rf-SQUIDs and coupled to the control line.

Further operations can include determining, by the system based on the monitoring data, a state change of the qubit.

Further operations can include communicating, by the system, information corresponding to the state change of the qubit to the quantum circuit for adjustment of a state of the qubit.

Further operations can include adjusting, by the system based on the monitoring data, the radio frequency signal.

Figure 13:
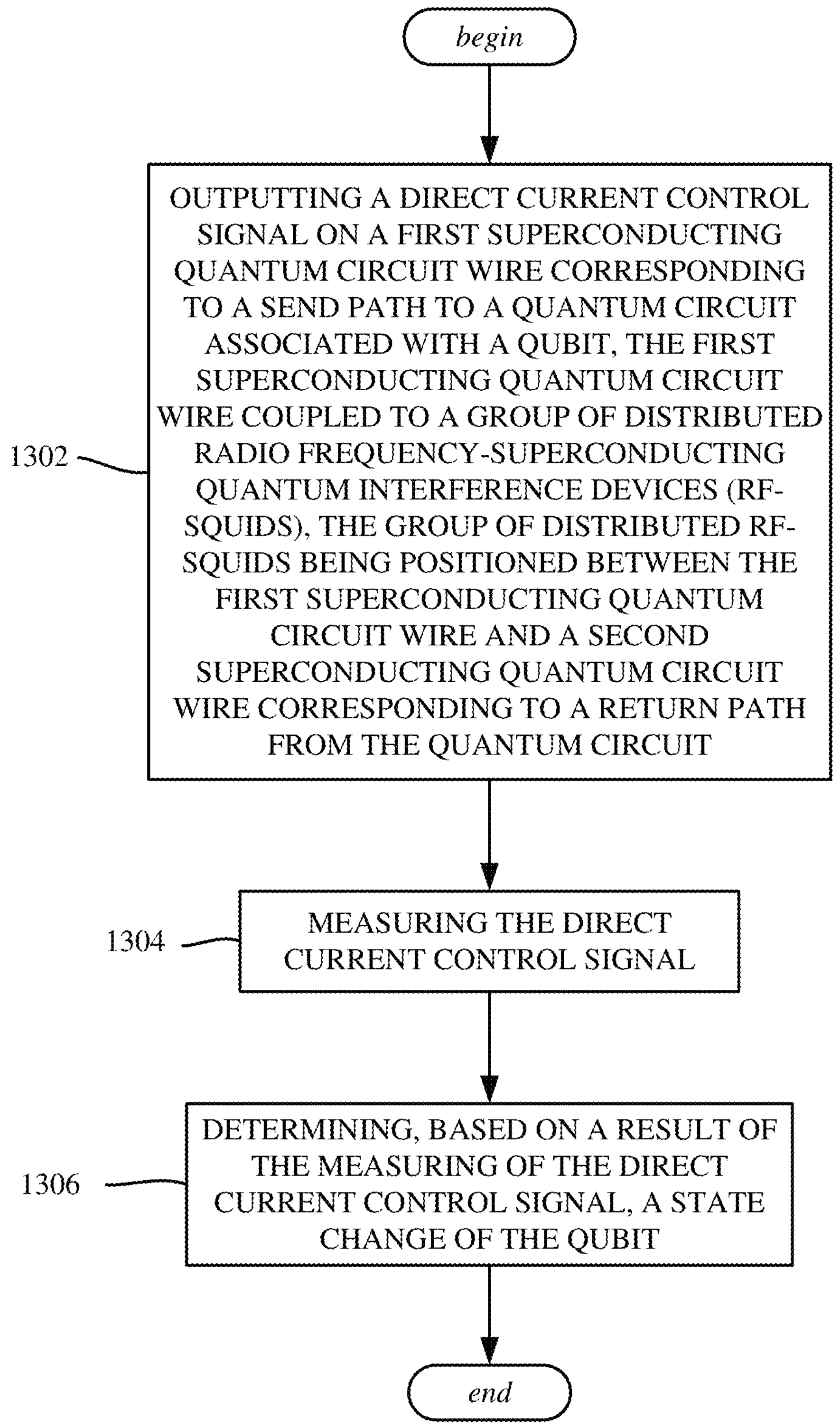
FIG. 13 is a flow diagram showing example operations related to outputting and inputting an RF signal to detect a qubit state transition, and notifying a quantum circuit of the qubit state transition, in accordance with various example embodiments and implementations of the subject disclosure.

FIG. 13 summarizes various example operations, e.g., corresponding to a machine-readable medium, including executable instructions that, when executed by at least one processor, facilitate performance of operations. Example operation 1302 represents outputting a radio frequency signal on a control line, the control line coupled by the radio frequency signal to a group of distributed radio frequency-superconducting quantum interference devices (rf-SQUIDs). The group of distributed rf-SQUIDs are positioned between a first superconducting quantum circuit wire corresponding to a send path to a quantum circuit associated with a qubit, and a second superconducting quantum circuit wire corresponding to a return path from the quantum circuit, in which the rf-SQUIDs of the group of rf-SQUIDs are coupled to qubit states of a quantum circuit associated with a qubit. Example operation 1304 represents inputting the radio frequency signal, as phase shifted by the group of distributed rf-SQUIDs based on a state transition of the qubit. Example operation 1306 represents processing the radio frequency signal as phase shifted to detect the state transition. Example operation 1308 represents communicating information corresponding to the state transition to the quantum circuit for adjustment of a state of the qubit.

Further operations can include adjusting a parameter applicable to the outputting of the radio frequency signal to adjust the outputting.

The state transition can include at least one of: decoherence of the qubit, or entanglement of the qubit.

As can be seen, the technology described herein facilitates accurately and reliably monitoring qubit states in quantum circuits. By distributing rf-SQUIDs along the superconducting quantum circuit wire at specific intervals, the system ensures comprehensive detection of qubit state changes, including entanglement, decoherence, and other state transitions. The integration of an independent control line running a low-power radio frequency signal allows for precise phase shift detection without adding significant load or noise to the superconducting quantum circuit wire, which significantly improves the fidelity and stability of quantum operations, ensuring that even small changes in qubit states are detected and corrected in real-time. In one implementation, the use of a classical computer equipped with a PCIe accelerator card further enhances the system's capability to process data quickly and provide immediate feedback, maintaining the integrity of quantum computations.

The viability of the technology described herein is underscored by its alignment with existing quantum computing infrastructure and its scalability. The strategic placement of rf-SQUIDs at specific intervals helps to optimize resource usage while maintaining high detection efficiency. The independent control line ensures that the system can operate without interfering with the primary quantum circuit, thus preserving the accuracy of measurements. The classical computer's ability to handle the computational demands of real-time monitoring and feedback without significant latency ensures that the system can be integrated into current and future quantum computing setups. This not only addresses the limitations of traditional qubit state detection methods, but also provides a robust framework for maintaining high-performance quantum operations, making it a practical and valuable enhancement in the field of quantum computing.

The above description of illustrated embodiments of the subject disclosure, comprising what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

As used in this application, the terms "component," "system," "platform," "layer," "selector," "interface," and the like are intended to refer to a computer-related resource or an entity related to an operational apparatus with one or more specific functionalities, wherein the entity can be either hardware, a combination of hardware and software, software, or software in execution. As an example, a component can be an apparatus with specific functionality provided by mechanical parts operated by electric or electronic circuitry. As yet another example, a component can be an apparatus that provides specific functionality through electronic components without mechanical parts, the electronic components can comprise a processor therein to execute software or firmware that confers at least in part the functionality of the electronic components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances.

While the embodiments are susceptible to various modifications and alternative constructions, certain illustrated implementations thereof are shown in the drawings and have been described above in detail. It should be understood, however, that there is no intention to limit the various embodiments to the specific forms disclosed, but on the contrary, the intention is to cover all modifications, alternative constructions, and equivalents falling within the spirit and scope.

In addition to the various implementations described herein, it is to be understood that other similar implementations can be used or modifications and additions can be made to the described implementation(s) for performing the same or equivalent function of the corresponding implementation(s) without deviating therefrom. Still further, multiple processing chips or multiple devices can share the performance of one or more functions described herein, and similarly, storage can be effected across a plurality of devices. Accordingly, the various embodiments are not to be limited to any single implementation, but rather are to be construed in breadth, spirit and scope in accordance with the appended claims.

What is claimed is:

1. A system, comprising:

a group of distributed radio frequency-superconducting quantum interference devices (rf-SQUIDs) coupled to qubit states of a quantum circuit associated with a qubit, the group of rf-SQUIDs positioned between a first superconducting quantum circuit wire corresponding to a send path to the quantum circuit, and a second superconducting quantum circuit wire corresponding to a return path from the quantum circuit; and a control line adjacent to the group of distributed rf-SQUIDs, the control line configured to:

carry a radio frequency signal generated by a computing device to generate magnetic flux that couples with the group of rf-SQUIDs, and return monitoring data, comprising at least one of: magnetic flux data representative of a magnitude of the magnetic flux, dynamic inductance data representative of a dynamic inductance of the magnetic flux, or phase shift data representative of a phase shift of the magnetic flux, to the computing device.

2. The system of claim 1, wherein the group of rf-SQUIDs is distributed between the first superconducting quantum circuit wire and the second superconducting quantum circuit wire at substantially even distances from one another.

3. The system of claim 1, wherein, based on the monitoring data, the computing device communicates feedback to a quantum processor for state adjustment of the qubit.

4. The system of claim 3, wherein the feedback indicates a qubit state change.

5. The system of claim 4, wherein the qubit state change indicates decoherence of the qubit.

6. The system of claim 4, wherein the qubit state change indicates entanglement of the qubit.

7. The system of claim 4, wherein the qubit state change indicates superposition collapse of the qubit.

8. The system of claim 1, wherein, based on the monitoring data, the computing device adjusts monitoring parameter data associated with the group of rf-SQUIDs.

9. The system of claim 8, wherein the monitoring parameter data comprises a current of the radio frequency signal.

10. The system of claim 8, wherein the monitoring parameter data comprises a frequency of the radio frequency signal.

11. The system of claim 1, wherein the computing device is coupled to the control line via a peripheral component interconnect express card.

12. The system of claim 1, wherein the control line is proximate to the first superconducting quantum circuit wire.

13. The system of claim 1, wherein the control line is proximate to the second superconducting quantum circuit wire.

14. A method, comprising:

sending, by a system comprising at least one processor, a radio frequency signal on a control line, the control line coupled by the radio frequency signal to a group of distributed radio frequency-superconducting quantum interference devices (rf-SQUIDs), wherein the group of distributed rf-SQUIDs is positioned between a first superconducting quantum circuit wire corresponding to a send path to a quantum circuit associated with a qubit, and a second superconducting quantum circuit wire corresponding to a return path from the quantum circuit, and wherein the rf-SQUIDs of the group of distributed rf-SQUIDs are coupled to qubit states of a quantum circuit associated with a qubit; and receiving, by the system via the control line, qubit state monitoring data comprising at least one of: magnetic flux data, dynamic inductance data, or phase shift data, sensed by the rf-SQUIDs and coupled to the control line.

15. The method of claim 14, further comprising determining, by the system based on the monitoring data, a state change of the qubit.

16. The method of claim 15, further comprising communicating, by the system, information corresponding to the state change of the qubit to the quantum circuit for adjustment of a state of the qubit.

17. The method of claim 14, further comprising adjusting, by the system based on the monitoring data, the radio frequency signal.

18. A non-transitory machine-readable medium, comprising executable instructions that, when executed by at least one processor, facilitate performance of operations, the operations comprising:

outputting a radio frequency signal on a control line, the control line coupled by the radio frequency signal to a group of distributed radio frequency-superconducting quantum interference devices (rf-SQUIDs), the group of distributed rf-SQUIDs being positioned between a first superconducting quantum circuit wire corresponding to a send path to a quantum circuit associated with a qubit, and a second superconducting quantum circuit wire corresponding to a return path from the quantum circuit, wherein the rf-SQUIDs of the group of rf-SQUIDs are coupled to qubit states of a quantum circuit associated with a qubit;

inputting the radio frequency signal, as phase shifted by the group of distributed rf-SQUIDs based on a state transition of the qubit;

processing the radio frequency signal as phase shifted to detect the state transition; and communicating information corresponding to the state transition to the quantum circuit for adjustment of a state of the qubit.

19. The non-transitory machine-readable medium of claim 18, wherein the operations further comprise adjusting a parameter applicable to the outputting of the radio frequency signal to adjust the outputting.

20. The non-transitory machine-readable medium of claim 18, wherein the state transition comprises at least one of: decoherence of the qubit, or entanglement of the qubit.

* * * * *